US009417296B2

(12) United States Patent
Akiyama

(10) Patent No.: US 9,417,296 B2
(45) Date of Patent: Aug. 16, 2016

(54) MAGNETIC SENSOR AND MANUFACTURING METHOD THEREOF

(75) Inventor: Osamu Akiyama, Yamanashi (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 678 days.

(21) Appl. No.: 13/403,051

(22) Filed: Feb. 23, 2012

(65) Prior Publication Data

US 2012/0212219 A1    Aug. 23, 2012

(30) Foreign Application Priority Data

Feb. 23, 2011    (JP) .................................. 2011-037200

(51) Int. Cl.
*G01R 33/09* (2006.01)
*B82Y 25/00* (2011.01)

(52) U.S. Cl.
CPC ............... *G01R 33/093* (2013.01); *B82Y 25/00* (2013.01); *Y10T 29/49139* (2015.01)

(58) Field of Classification Search
CPC .... G01R 33/09; G01R 33/093; G01R 33/096; G01R 15/205; G01R 17/105
See application file for complete search history.

(56) References Cited

U.S. PATENT DOCUMENTS

| 4,429,276 | A | | 1/1984 | Narimatsu et al. | |
| 4,835,510 | A | | 5/1989 | Shibasaki et al. | |
| 5,585,775 | A | * | 12/1996 | Ishishita | 338/32 R |
| 7,057,260 | B2 | | 6/2006 | Kagotani et al. | 257/620 |
| 7,830,143 | B2 | * | 11/2010 | Mitsuzuka | 324/252 |
| 7,956,610 | B2 | * | 6/2011 | Granig et al. | 324/252 |
| 8,093,670 | B2 | * | 1/2012 | Taylor | 257/427 |
| 8,692,133 | B2 | * | 4/2014 | Cho | 174/261 |
| 2009/0128282 | A1 | * | 5/2009 | Zimmer et al. | 338/32 R |

FOREIGN PATENT DOCUMENTS

| GB | 2034053 A | 5/1980 |
| JP | S61-27691 A | 2/1986 |
| JP | S63-170981 A | 7/1988 |
| JP | S63-311117 A | 12/1988 |

(Continued)

OTHER PUBLICATIONS

Japanese Office Action issued for counterpart application JP 2011-037200, mail date Apr. 22, 2014 (with English translation).

(Continued)

*Primary Examiner* — Tung X Nguyen
*Assistant Examiner* — Feba Pothen
(74) *Attorney, Agent, or Firm* — Arent Fox LLP

(57) ABSTRACT

For each of electric current path units each including series-connected resistor elements, one end is electrically connected with power supply terminal Vcc, the other end is electrically connected with ground terminal GND, and connection portion between the resistor elements is electrically connected with output terminals Vo1-Vo4. Resistor element constituting each of the electric current path units is a magnetoresistance effect element formed of magnetoresistance effect film, the power supply terminal and ground terminal are each shared among all the electric current path units. All the electric current path units are formed to contact one surface of insulating film; and with use of conductive film disposed to contact the other surface of the insulating film, power supply connection wiring for sharing the power supply terminal and ground connection wiring for sharing the ground terminal are formed.

14 Claims, 12 Drawing Sheets

(56) References Cited

FOREIGN PATENT DOCUMENTS

| | | |
|---|---|---|
| JP | H01-153967 A | 6/1989 |
| JP | H0145008 B2 | 10/1989 |
| JP | 9-63843 A | 3/1997 |
| JP | H09-325049 A | 12/1997 |
| JP | H10-270774 A | 10/1998 |
| JP | H11-330584 A | 11/1999 |
| JP | 2002350136 A | 12/2002 |
| JP | 2004518110 A | 6/2004 |
| JP | 2006029900 A | 2/2006 |
| JP | 2007157221 A | 6/2007 |
| JP | 2008096358 A | 4/2008 |
| JP | 2008-224406 A | 9/2008 |
| WO | WO-2010/013690 A1 | 2/2010 |

OTHER PUBLICATIONS

Japanese Office Action issued for Japanese Patent Application No. 2011-37200, mailed May 10, 2016 (Partial translation of Japanese Office Action).

* cited by examiner

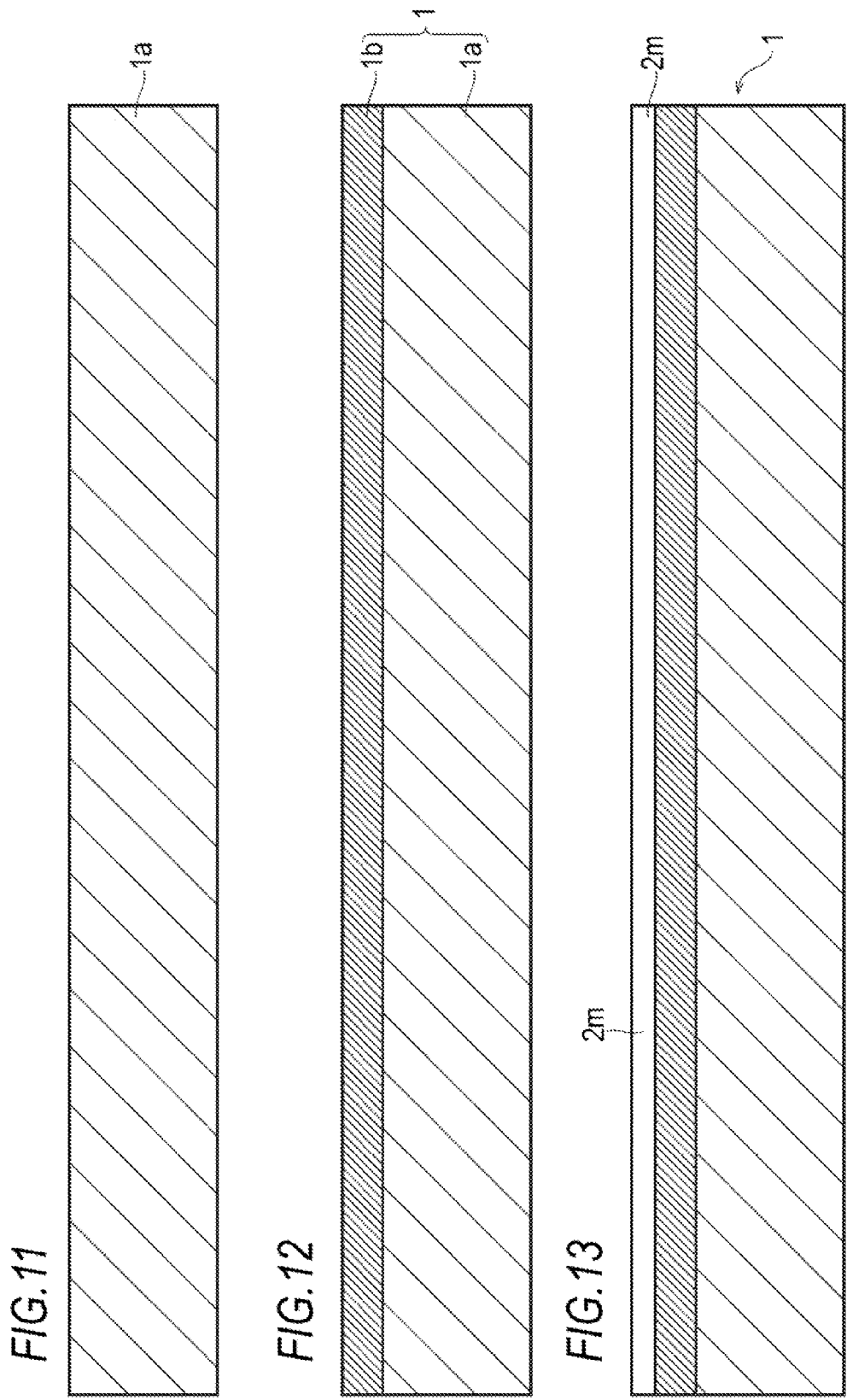

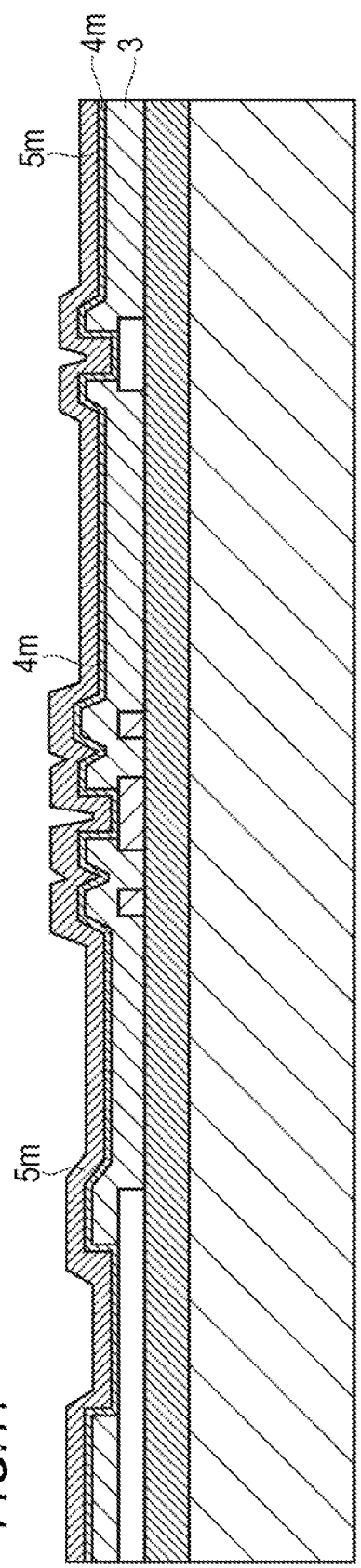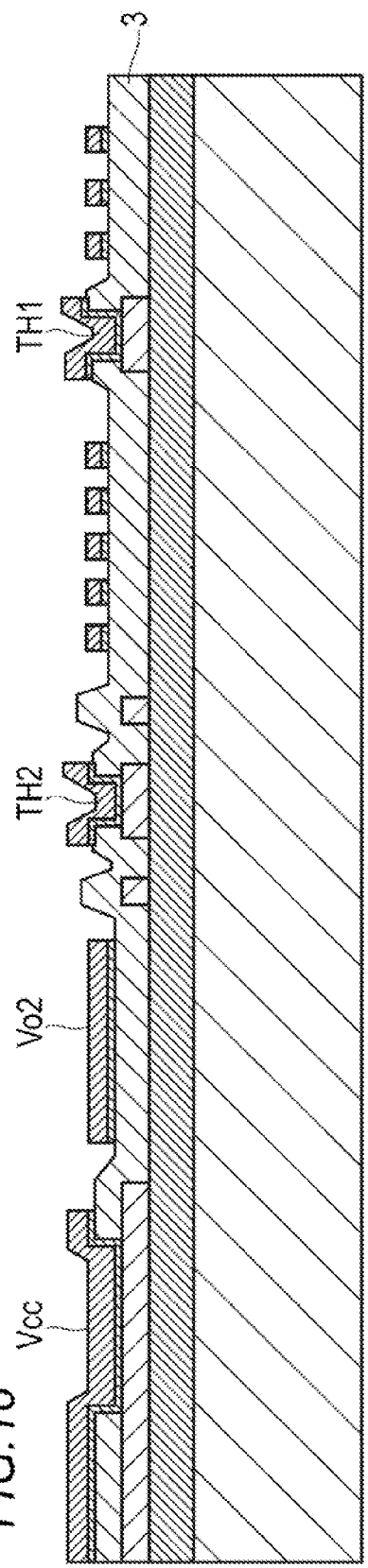

MAGNETIC SENSOR AND MANUFACTURING METHOD THEREOF

TECHNICAL FIELD

The present invention relates to a magnetic sensor configured to detect an external magnetic field to be applied so as to obtain an output in accordance with the detected external magnetic field.

BACKGROUND ART

As a magnetic sensor advantageous for size reduction and high-accuracy detection, there has been used a magnetic sensor which includes an MR element (Magnetoresistance effect element or magnetoresistance element) formed using a magnetoresistance effect film formed in an elongated pattern or shape extending in a certain direction and which is configured to provide an output corresponding to an applied external magnetic field from an output terminal when voltage is applied between a power supply terminal and a ground terminal (refer to, e.g., PTL 1 and PTL 2). For such a magnetic sensor, further miniaturization is now required.

For example, a small camera incorporated in a mobile terminal device (mobile phone, smart phone, mobile personal computer, etc.) uses an actuator for developing driving force causing an optical lens (or optical lens group) to move in the optical axis direction in order to achieve an autofocus function or an optical zoom function. To such an actuator is input a position detection signal output from a linear encoder having a structure formed by a combination of a magnetic sensor using the above-mentioned MR element and a multipolar magnet. To obtain a high-accuracy autofocus function or a high-accuracy optical zoom function, it is necessary to perform control for moving an optical lens at a very fine pitch. Accordingly, to enhance position detection accuracy, narrowing of magnetization pitch of the multipolar magnet and thus narrowing of arrangement pitch of resistor elements including the MR elements is required in the linear encoder.

As described above, further narrowing of the arrangement pitch of the resistor elements such as the MR elements is required for the magnetic sensor used to constitute the linear encoder or a rotary encoder operating under the same principle. The narrowing of the arrangement pitch of the resistor elements such as the MR elements contributes also to miniaturization of the magnetic sensor.

As a magnetoresistance effect film constituting the MR element used in such a magnetic sensor, an Ni—Fe alloy film and an Ni—Fe—Co alloy film capable of bringing out an anisotropic magnetoresistance effect (AMR effect) and capable of being formed in a single layer can be used (refer to, e.g., PTL 3).

CITATION LIST

Patent Literature

{PTL 1} JP-A-2006-29900
{PTL 2} JP-A-2008-96358
{PTL 3} JP-09-63843

SUMMARY OF INVENTION

Technical Problem

In the magnetic sensor disclosed in PTL 1, a plurality of MR elements are laminated with insulating film interposed therebetween in order to enhance the detection accuracy. As the number of the MR elements to be arranged increases, it is necessary to laminate large numbers of magnetoresistance effect films and insulating films, requiring connection of the MR elements through a through-hole formed in each insulating film, which disadvantageously complicates the manufacturing process. Further, since the plurality of MR elements are formed using magnetoresistance effect films of different layers, it is disadvantageously difficult to obtain high-performance sensor characteristics in a stable manner.

PTL 2 discloses a magnetic sensor (magnetic detector) in which an electrode layer provided at the end portion of an MR element and a power supply pad are connected to each other through a power supply wiring layer on a substrate, and in which an electrode layer provided at the end portion of a fixed resistor element and a grounding pad are connected to each other through a grounding wiring layer on the substrate. PTL 2 further discloses that a plurality of resistor elements such as the MR elements and fixed resistor elements are prepared to form a bridge circuit. However, PTL 2 provides no countermeasure against an increase in the sensor dimension associated with an increase in the number of the resistor elements. Further, in the magnetic sensor disclosed in PTL 2, a shield layer held between an insulating protective layer and a flattering layer is disposed on the substrate, disadvantageously complicating a layer configuration and therefore manufacturing process.

PTL 3 discloses that a plurality of MR elements are used to form a bridge circuit. However, PTL 3 provides no countermeasure against an increase in the sensor dimension associated with an increase in the number of the MR elements.

An object of the present invention is to provide a magnetic sensor capable of suppressing an increase in the sensor dimension and thus advantageous for miniaturization, capable of obtaining high-performance sensor characteristics in a stable manner, and capable of preventing the manufacturing process from being complicated, even in the case where the number of resistor elements such as the MR elements to be used increases.

Another object of the present invention is to provide a magnetic sensor manufacturing method capable of obtaining the above-mentioned magnetic sensor with a simple way.

Solution to Problem

According to the present invention, in order to solve one of the above objects, there is provided a magnetic sensor, wherein:

a plurality of electric current path units each including a plurality of series-connected resistor elements are provided;

for each of the electric current path units, one end thereof is electrically connected with a power supply terminal, the other end thereof is electrically connected with a ground terminal, and a connection portion between the resistor elements is electrically connected with an output terminal;

at least one of the plurality of resistor elements constituting each of the electric current path units is a magnetoresistance effect element formed of a magnetoresistance effect film;

the power supply terminal is shared among all the electric current path units, and the ground terminal is shared among all the electric current path units;

all the electric current path units are formed so as to contact one surface of an insulating film; and with use of a conductive film disposed so as to contact the other surface of the insulating film, a power supply connection wiring for achieving the sharing of the power supply terminal and a ground connection wiring for achieving the sharing of the ground terminal are formed.

In one aspect of the present invention, each of the resistor elements has at least one U-like unit part including two elongated parts extending in parallel to each other in a certain direction and a connecting part connecting one of the ends of one of the elongated parts with one of the ends of the other of the elongated parts. In one aspect of the present invention, the elongated parts of all the resistor elements extend in parallel to each other in the same certain direction, and all the resistor elements are arranged in a direction orthogonal to the certain direction. In one aspect of the present invention, the number of the electric current path units provided is four, out of the four electric current path units, two electric current path units constitute a first group, and the remaining two constitute a second group, and the electric current path units of the first group and those of the second group are disposed opposite to each other in such an intermingled manner that the elongated parts of the resistor elements belonging to the first group and elongated parts of the resistor elements belonging to the second group are alternately repeated in the direction orthogonal to the certain direction.

In one aspect of the present invention, in the first group, the output terminal of each of the electric current path units is disposed on a first side of the resistor elements in the certain direction, in the second group, the output terminal of each of the electric current path units is disposed on a second side of the resistor elements opposite to the first side in the certain direction, the power supply terminal is disposed on the first side of the resistor elements, and the ground terminal is disposed on the second side of the resistor elements.

In one aspect of the present invention, all the plurality of resistor elements constituting each of the electric current path units are the magnetoresistance effect elements. In one aspect of the present invention, in each of the electric current path units, portions other than the magnetoresistance effect elements have a laminated structure of a magnetoresistance effect film and a conductive layer. In one aspect of the present invention, each of the electric current path units includes the magnetoresistance effect elements, an intermediate conductive connecting part connecting the magnetoresistance effect elements with each other, a one end conductive connecting part connected to the magnetoresistance effect element and extending up to one end of the electric current path unit, and an other end conductive connecting part connected to the magnetoresistance effect element and extending up to the other end of the electric current path unit.

In one aspect of the present invention, the insulating film is formed on an insulating surface part of a substrate in such a manner that the other surface of the insulating film covers the power supply connection wiring and ground connection wiring. In one aspect of the present invention, the substrate is bonded to a pad part of a lead frame, and an external connection power supply terminal part wire-bonded to the power supply terminal, an external connection ground terminal part wire-bonded to the ground terminal, and a plurality of external connection output terminal parts each wire-bonded to the output terminals are mounted on a lead part of the lead frame.

In one aspect of the present invention, an insulating protective film is formed on one surface of the insulating film so as to cover the electric current path units. In one aspect of the present invention, apertures are formed in the insulating protective film so as to expose the power supply terminal, ground terminal, and output terminals, respectively.

In one aspect of the present invention, the ground connection wiring is formed including a planar area of a size containing all the magnetoresistance effect elements.

According to the present invention, in order to solve one of the above objects, there is provided a manufacturing method of the magnetic sensor as mentioned in the above, comprising:

forming a conductive film on an insulating surface part of a substrate and applying patterning to the conductive film to form the power supply connection wiring and ground connection wiring;

forming an insulating film on the insulating surface part of the substrate so as to cover the power supply connection wiring and ground connection wiring;

forming through-holes in required positions of the insulating film;

forming the electric current path units on the insulating film, while connecting some of one end conductive connecting parts connected to the respective resistor elements and extending up to one end of the respective electric current path units to the power supply connection wiring through the required through-holes, and connecting some of other end conductive connecting parts connected to the respective resistor elements and extending up to the other end of the respective electric current path units to the ground connection wiring through the required through-holes; and forming the power supply terminal so as to be connected to one or some other of the one end conductive connecting parts, forming the ground terminal so as to be connected to one or some other of the other end conductive connecting parts, and forming the output terminal so as to be connected to an intermediate conductive connecting part connecting the resistor elements of each of the electric current path units with each other.

In one aspect of the present invention, in forming the electric current path units, a magnetoresistance effect film and a conductor layer are formed in this order on the insulating film, the magnetoresistance effect film and conductor layer are patterned into a shape corresponding to required electric current path units, and then, out of the remaining conductor layer, only portions corresponding to the resistor elements are removed to thereby form the resistor elements each formed of the magnetoresistance effect film, and the one end conductive connecting parts, the other end conductive connecting parts, and the intermediate conductive connecting parts each having a laminated structure of the magnetoresistance effect film and conductor layer. In one aspect of the present invention, in patterning the magnetoresistance effect film and conductor layer, portions corresponding to the power supply terminal, ground terminal, and output terminal are made to remain, an insulating protective film is formed on the insulating film so as to cover the remaining magnetoresistance effect film and conductor layer, and apertures are formed in required positions of the insulating protective film, whereby the power supply terminal, ground terminal, and output terminal are formed by some portions of the laminated structure of the magnetoresistance effect film and conductor layer that are exposed through the apertures.

Advantageous Effects of Invention

According to the present invention, there is provided a magnetic sensor capable of suppressing an increase in the sensor dimension and thus advantageous for miniaturization, capable of obtaining high-performance sensor characteristics in a stable manner, and capable of preventing the manufacturing process from being complicated, even in the case where the number of resistor elements such as the MR elements to be used increases:

According to the present invention, there is provided a magnetic sensor manufacturing method capable of obtaining the above-mentioned magnetic sensor with a simple way.

BRIEF DESCRIPTION OF DRAWINGS

FIG. 11 A cross-sectional view schematically illustrating a manufacturing process of the magnetic sensor according to the exemplary embodiment of FIG. 1.

FIG. 12 A cross-sectional view schematically illustrating a manufacturing process of the magnetic sensor according to the exemplary embodiment of FIG. 1.

FIG. 13 A cross-sectional view schematically illustrating a manufacturing process of the magnetic sensor according to the exemplary embodiment of FIG. 1.

FIG. 17 A cross-sectional view schematically illustrating a manufacturing process of the magnetic sensor according to the exemplary embodiment of FIG. 1.

FIG. 18 A cross-sectional view schematically illustrating a manufacturing process of the magnetic sensor according to the exemplary embodiment of FIG. 1.

DESCRIPTION OF EMBODIMENTS

Exemplary embodiments of the present invention will be described in detail with reference to the drawings.

Figure 1:
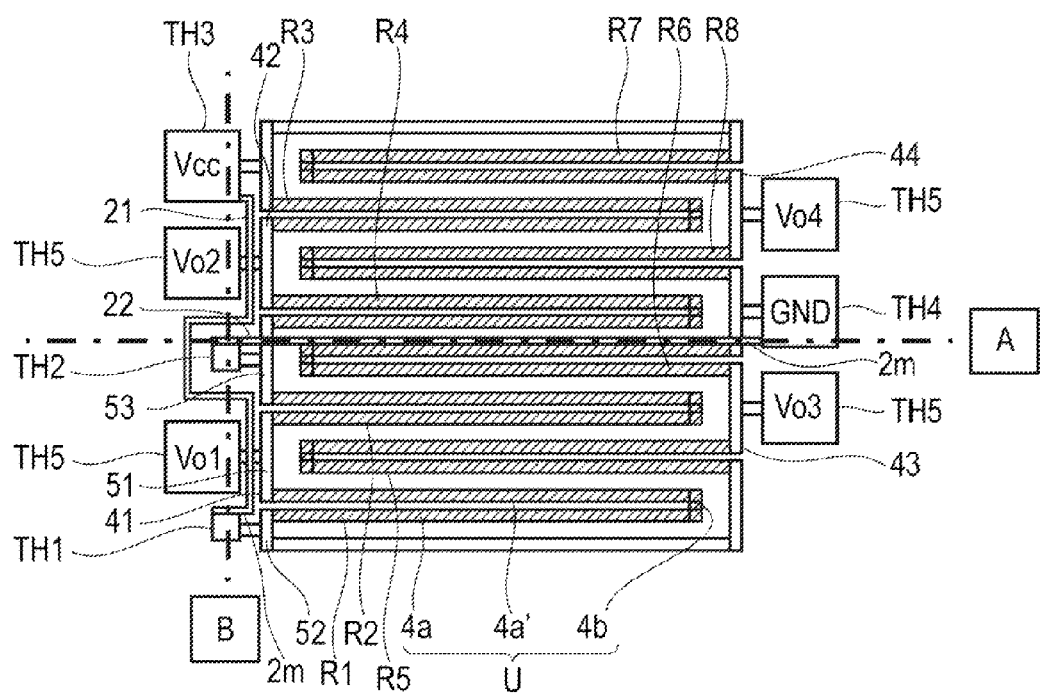
FIG. 1 A plan view schematically illustrating an exemplary embodiment of a magnetic sensor according to the present invention.
Figure 2:
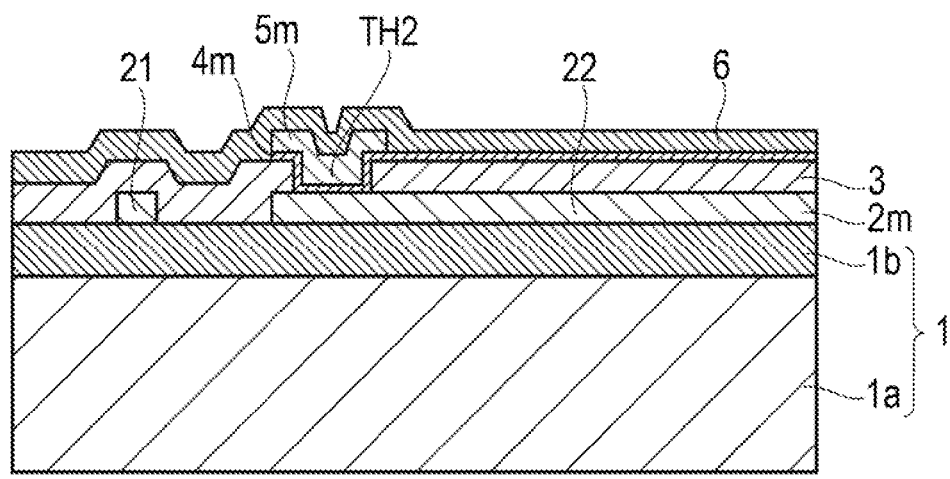
FIG. 2 A first partial cross-sectional view taken along a line A in FIG. 1.
Figure 3:
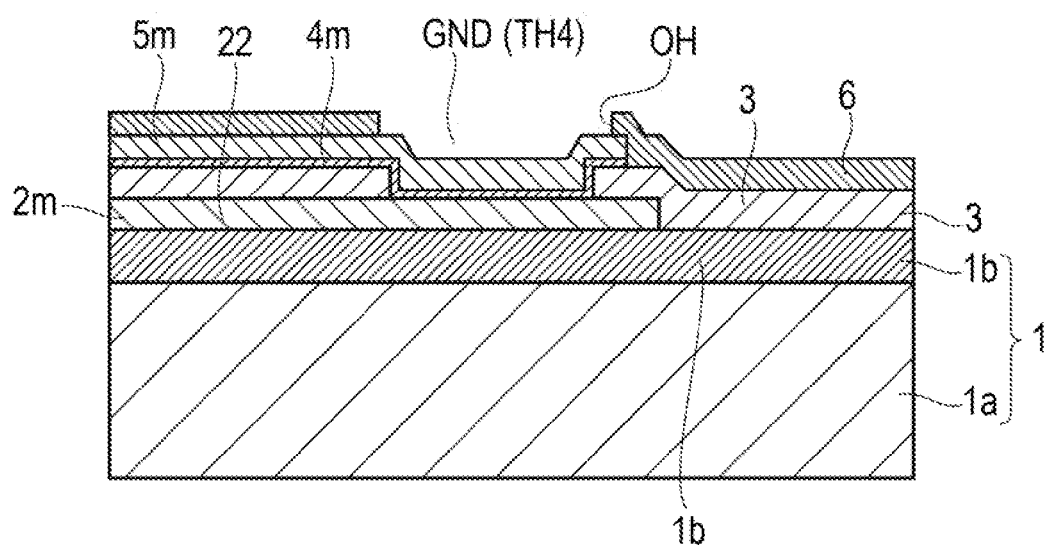
FIG. 3 A second partial cross-sectional view taken along the line A in FIG. 1.
Figure 4:
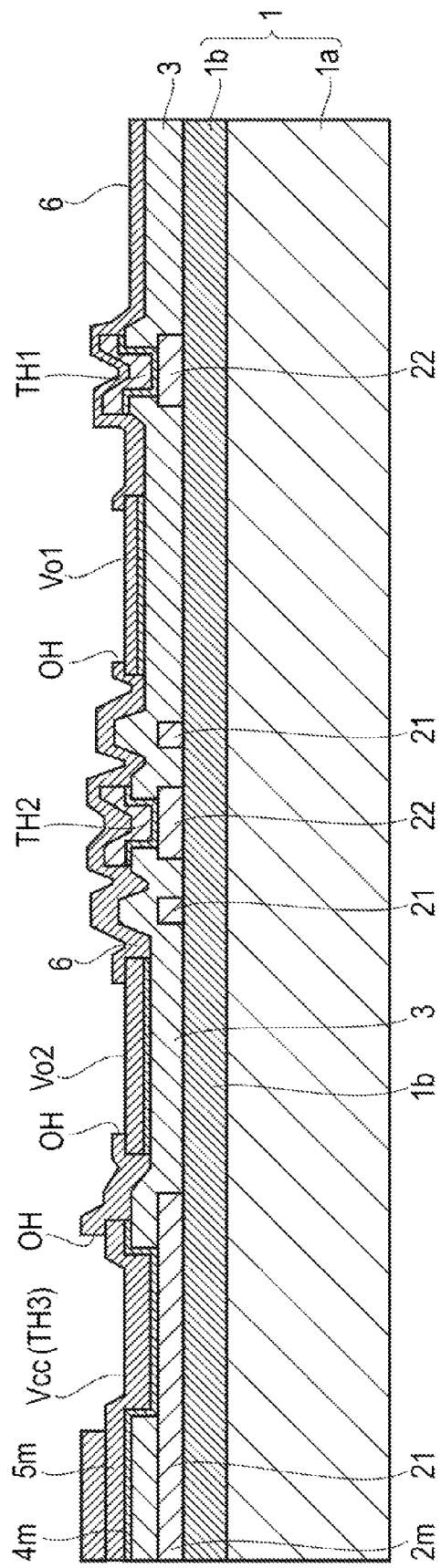
FIG. 4 A cross-sectional view taken along a line B in FIG. 1.
Figure 5:
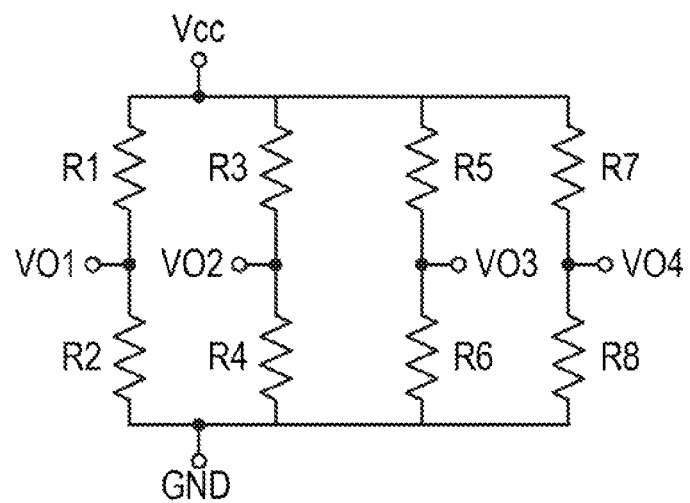
FIG. 5 An equivalent circuit diagram of the magnetic sensor according to the exemplary embodiment of FIG. 1.
Figure 6:
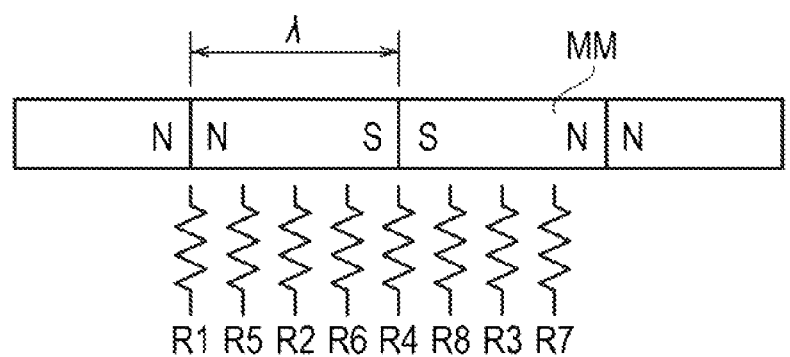
FIG. 6 A view schematically illustrating a positional relationship between a multipolar magnet and resistor elements of the magnetic sensor in a linear encoder or a rotary encoder constructed using the magnetic sensor according to the exemplary embodiment of FIG. 1.

FIG. 1 is a plan view schematically illustrating an exemplary embodiment of a magnetic sensor according to the present invention. FIGS. 2, 3, and 4 are a first partial cross-sectional view taken along a line A in FIG. 1, a second partial cross-sectional view taken along the line A in FIG. 1, and a cross-sectional view taken along a line B in FIG. 1, respectively. FIG. 5 is an equivalent circuit diagram of the magnetic sensor according to the present exemplary embodiment, and FIG. 6 is a view schematically illustrating a positional relationship between a multipolar magnet and resistor elements of the magnetic sensor in a linear encoder or a rotary encoder constructed using the magnetic sensor according to the present exemplary embodiment.

The magnetic sensor according to the present exemplary embodiment is constructed using a substrate 1 in which at least a surface part thereof has insulating property. For example, the substrate 1 may be obtained by forming an insulating layer 1b on one main surface (top surface, in FIGS. 2 to 4) of a plate-like base member 1a which is made of semiconductor (silicon, etc.), insulator (glass, alumina, etc.) or conductor, as illustrated in FIGS. 2 to 4. Alternatively, as the substrate 1, a plate-like member made of insulator such as glass or aluminum may be used alone.

Power supply connection wiring 21 and ground connection wiring 22 which are each formed of a patterned conductive film 2m are formed on the top surface of the substrate 1 so as to contact the insulating surface part (insulating layer 1b, in FIGS. 2 to 4) of the substrate 1. Examples of the conductive film 2m forming the power supply connection wiring 21 and ground connection wiring 22 include, e.g., an aluminum (Al) film, an aluminum-copper (Al—Cu) film, an aluminum-silicon (Al—Si) film, an aluminum-silicon-copper (Al—Si—Cu) film or a gold (Au) film. These conductive films are easily patterned by dry etching. The power supply connection wiring 21 is provided for the shared use of a power supply terminal, and the ground connection wiring 22 is provided for the shared use of a ground terminal. Details of the shared use of the terminals will be described later.

An insulating film 3 is formed on the top surface of the substrate 1, i.e., on the insulating surface part (insulating layer 1b, in FIGS. 2 to 4) of the substrate 1 so as to cover the power supply connection wiring 21 and ground connection wiring 22. Examples of the insulating film 3 include a silicon oxide film, a silicon nitride film, a silicon oxynitride film, a phosphorus silicate glass (PSG) film, and a boron-phosphorus silicate glass (BPSG) film.

Four electric current path units (or energizing path units) 41, 42, 43, and 44 are formed on the insulating film 3. The electric current path unit 41 has serially-connected two magnetoresistance effect elements (hereinafter, referred to "MR elements") R1 and R2. The electric current path unit 42 has serially-connected two MR elements R3 and R4. The electric current path unit 43 has serially-connected two MR elements R5 and R6. The electric current path unit 44 has serially-connected two MR elements R7 and R8.

Each MR element is formed using a magnetoresistance effect film. The magnetoresistance effect film exhibits a change in the resistance value depending on the magnitude of a magnetic filed component with respect to a given direction based on the magnetic anisotropy. For example, a film such as a nickel-iron (Ni—Fe) alloy film or a nickel-iron-cobalt (Ni—Fe—Co) alloy film capable of bringing out an anisotropic magnetoresistance effect (AMR effect) and capable of being formed in a single layer which is described in PTL 3 can be used as the magnetoresistance effect film.

The MR element R1 has a U-like unit part U constituted by two elongated parts (or extending parts) 4a and 4a' extending in parallel to each other in a certain direction (horizontal direction in FIG. 1 [direction parallel to the line A]) and a connecting part 4b connecting one of the ends of the elongated part 4a with one of the ends of the elongated part 4a'. The MR element R1 may be formed by connecting in series two or more U-like unit parts U arranged in parallel and in the same direction.

The MR elements R2 to R8 each have the same configuration.

All the MR elements R1 to R8 each have a configuration in which the elongated parts 4a and 4a' are arranged in the direction (vertical direction in FIG. 1 [direction parallel to the line B]) orthogonal to the certain direction so as to extend in parallel to each other.

Although the two resistor elements constituting each of the electric current path units 41, 42, 43, and 44 are all the MR elements in the present exemplary embodiment, the present invention is not limited to this configuration. In the present invention, at least one of the plurality of resistor elements constituting each of the electric current path units is required to be the MR element, and others may be resistor elements (those having no magnetic anisotropy) other than the MR element.

In the present exemplary embodiment, the electric current path unit 41 further has an intermediate conductive connecting part 51 connecting the MR element R1 and MR element R2, a one end conductive connecting part 52 connected to the MR element R1 and extending to one end of the electric current path unit, and an other end conductive connecting part 53 connected to the MR element R2 and extending to the other end of the electric current path unit. These conductive connecting parts 51 to 53 and MR elements R1 and R2 constitute the electric current path unit 41.

The electric current path units 42, 43, and 44 each have the same configurations. That is, as in the electric current path unit 41, the electric current path units 42, 43, and 44 each have the intermediate conductive connecting part 51 connecting the MR elements, one end conductive connecting part 52 connected to one MR element and extending up to one end of the electric current path unit, and other end conductive connecting part 53 connected to the other MR element and extending up to the other end of the electric current path unit.

As illustrated in FIGS. 2 to 4, the intermediate conductive connecting part 51, one end conductive connecting part 52, and other end conductive connecting part 53 each have a laminated structure of a magnetoresistance effect film 4m and a conductor layer 5m. The magnetoresistance effect film 4m is very thin (e.g., 0.03 μm) while the conductor layer 5m is comparatively thick (e.g., 0.6 μm) and thus the laminated structure exhibits sufficient conductivity as a whole based on the conductor layer 5m. Examples of the conductor layer 5m include an aluminum (Al) film, an aluminum-copper (Al—Cu) film, an aluminum-silicon (Al—Si) film, an aluminum-silicon-copper (Al—Si—Cu) film or a gold (Au) film as in the conductive film constituting the power supply connection wiring 21 and ground connection wiring 22.

As described above, the electric current path units 41, 42, 43, and 44 are formed so as to contact one surface, i.e., the top surface, of the insulating film 3, and the other surface, i.e., the lower surface, of the insulating film 3 covers the power supply connection wiring 21 and ground connection wiring 22 formed of the conductive film 2m.

Output terminals Vo1, Vo2, Vo3, and Vo4 are formed so as to be connected to the intermediate conductive connecting parts 51 of the respective electric current path units. A power supply terminal Vcc is formed so as to be connected to the one end conductive connecting part 52 connected to the MR elements R3 and R7, and a ground terminal GND is formed so as to be connected to the other end conductive connecting part 53 connected to the MR elements R6 and R8. These output terminals Vo1, Vo2, Vo3, and Vo4, power supply terminal Vcc, and ground terminal GND are formed contiguous to the intermediate conductive connecting part 51, one end conductive connecting part 52, and other end conductive connecting part 53, respectively, so as to have the similar configuration to each other and each include the laminated structure of the magnetoresistance effect film 4m and conductor layer 5m.

Through-holes TH1, TH2, TH3, TH4, and TH5 are formed in required positions of the insulating film 3. Some of the one end conductive connecting parts 52 are connected to the power supply connection wiring 21 through the required through-hole TH1 (i.e., through a conductor within through-hole having the laminated structure of the magnetoresistance effect film 4m and conductor layer 5m). Some of the other end conductive connecting parts 53 are connected to the ground connection wiring 22 through the required through-hole TH2 (i.e., through a conductor within through-hole having the laminated structure of the magnetoresistance effect film 4m and conductor layer 5m).

Some other of the one end conductive connecting parts 52 are connected to the power supply terminal Vcc formed of a conductor having the laminated structure of the magnetoresistance effect film 4m and conductor layer 5m within the required through-hole TH3. Some other of the other end conductive connecting parts 53 are connected to the ground terminal GND formed of a conductor having the laminated structure of the magnetoresistance effect film 4m and conductor layer 5m within the required through-hole TH4.

The intermediate conductive connecting parts 51 are connected respectively to the output terminals Vo1, Vo2, Vo3, and Vo4 each formed of a conductor having the laminated structure of the magnetoresistance effect film 4m and conductor layer 5m within the required through-hole TH5.

The through-holes TH3, TH4, and TH5 each have a terminal functioning as a wire bonding pad as described later and are thus formed larger than the through-holes TH1 and TH2 not having such a terminal. For example, the sizes of the through-holes TH1 and TH2 may each be set to 30 μm square, and the sizes of the through-holes TH3, TH4, and TH5 may each be set to 70 μm square.

An insulating protective film 6 is formed on one surface, i.e., the top surface, of the insulating film 3 so as to cover the electric current path units 41, 42, 43, and 44. Some apertures OH are formed in the insulating protective film 6, and the output terminals Vo1, Vo2, Vo3, and Vo4, power supply terminal Vcc, and ground terminal GND are exposed from the insulating protective film 6 through the apertures OH. Example of the insulating protective film 6 include a silicon oxide film, a silicon nitride film, a silicon oxynitride film, a phosphorus silicate glass (PSG) film, and a boron-phosphorus silicate glass (BPSG) film as in the insulating film 3.

As described above, with regard to each of the electric current path units 41, 42, 43, and 44, one end is electrically connected directly or through the power supply connection wiring 21 to the power supply terminal Vcc, the other end is electrically connected directly or through the ground connection wiring 22 to the ground terminal GND, and connection portion between the MR elements is electrically connected directly to the output terminals Vo1, Vo2, Vo3, and Vo4, respectively.

That is, the power supply terminal Vcc is shared among all the electric current path units 41, 42, 43, and 44, and the ground terminal GND is also shared among all the electric current path units 41, 42, 43, and 44. Thus, the four electric current path units 41, 42, 43, and 44 are connected to the single common power supply terminal Vcc and single common ground terminal GND, respectively.

Of the four electric current path units, the two electric current path units 41 and 42 constitute a first group and two electric current path units 43 and 44 constitute a second group. The electric current path units of the first group and those of the second group are disposed opposite to each other in such an intermingled manner that the elongated parts 4a and 4a' of the MR elements R1 to R4 belonging to the first group and elongated parts 4a and 4a' of the MR elements R5 to R8 belonging to the second group are alternately repeated in the direction of the line B orthogonal to the certain direction.

In the first group, the output terminals Vo1 and Vo2 of the electric current path units 41 and 42 are disposed on a first side (left side in FIG. 1) of the MR elements R1 to R4 in the direction of the line A which is the certain direction. On the other hand, in the second group, the output terminals Vo3 and Vo4 of the electric current path units 43 and 44 are disposed on a second side (right side in FIG. 1) of the MR elements R5 to R8 opposite to the first side in the direction of the line A which is the certain direction. The power supply terminal Vcc is disposed on the first side (left side in FIG. 1), and the ground terminal GND is disposed on the second side (right side in FIG. 1).

The MR elements R1 to R8 are arranged at an equal pitch, and the pitch size is set to ¼ of the distance between magnetic poles (minimum distance between N and S poles) of a multipolar magnet MM as illustrated in FIG. 6. In this case, a plurality of voltage signal outputs having different phases can be obtained from the output terminals Vo1 to Vo4 of a bridge circuit illustrated in FIG. 5, and information indicating the relationship between the multipolar magnet MM and magnetic sensor can be obtained based on the voltage signal outputs. Such an encoder function itself is well known, and the description thereof will be omitted.

In the present exemplary embodiment, the power supply terminal Vcc and ground terminal GND are each shared among all the electric current path units 41, 42, 43, and 44, so that a reduction in the number of the terminals can be achieved to allow miniaturization of the magnetic sensor. Further, in the present exemplary embodiment, the MR elements R1 to R8 are formed using the same magnetoresistance effect film 4m, making it possible to stably obtain high-performance sensor characteristics and to prevent the manufacturing process from being complicated. Further, the four electric current path units 41, 42, 43, and 44 each having a configuration in which the two MR elements each having the U-like unit part U are connected in series are divided into two groups, and the two groups are disposed opposite to each other in such an intermingled manner as described in the above. As a result, it is possible to achieve miniaturization of the magnetic sensor while ensuring the required certain direction length of the MR element to ensure required sensor characteristics.

Figure 7:
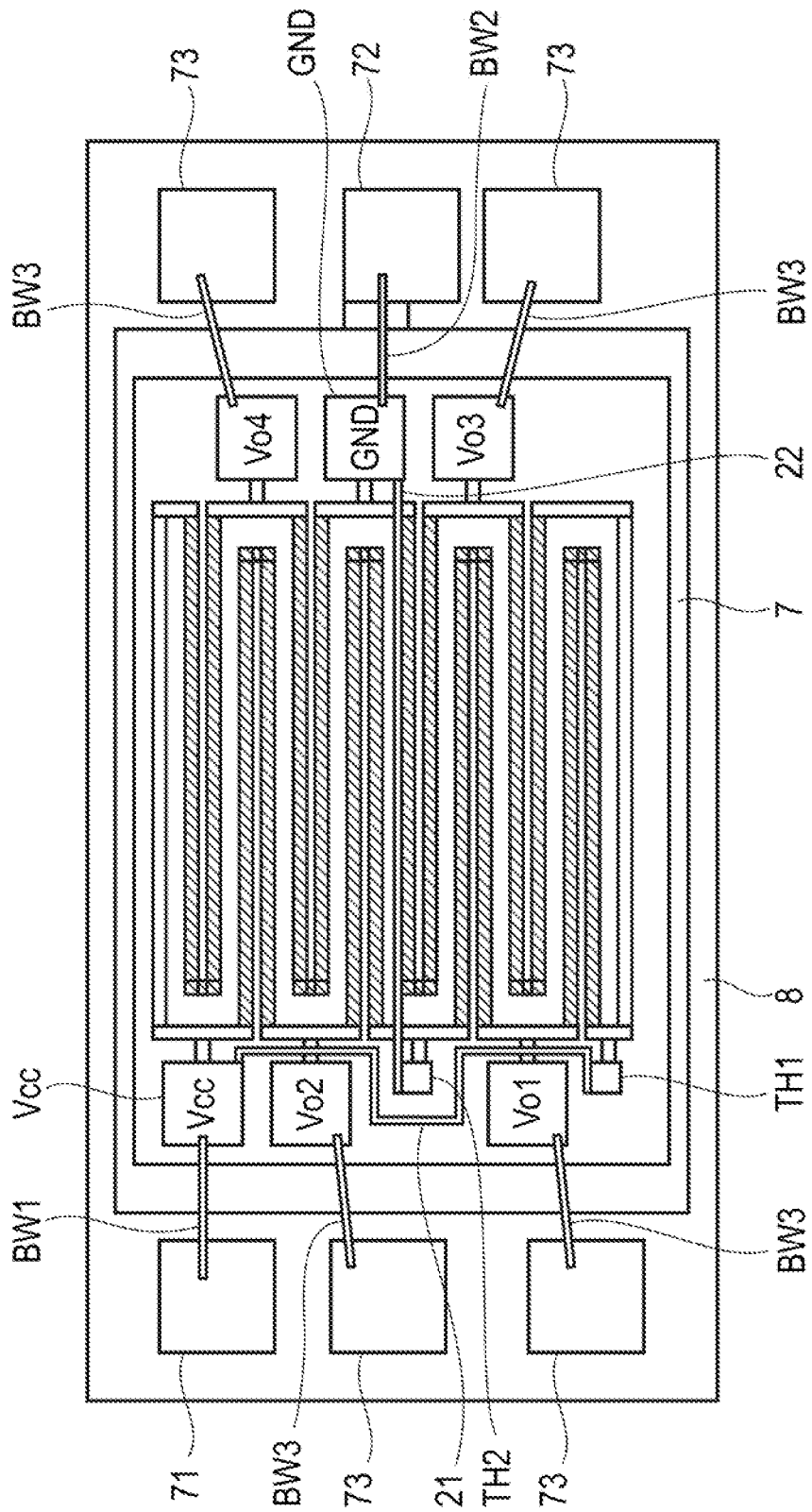
FIG. 7 A plan view schematically illustrating an embodiment in which the magnetic sensor of the exemplary embodiment of FIG. 1 is housed in a package.
Figure 8:
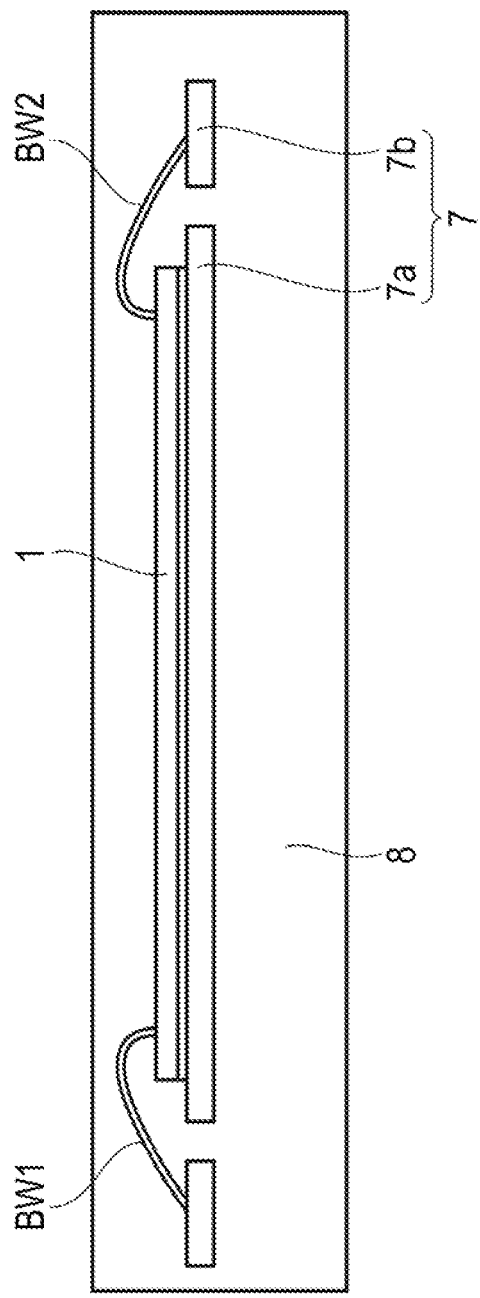
FIG. 8 A schematic cross-sectional view of FIG. 7.

FIG. 7 is a plan view schematically illustrating an embodiment in which the magnetic sensor of the present exemplary embodiment is housed in a package, and FIG. 8 is a schematic cross-sectional view of FIG. 7.

As illustrated in FIGS. 7 and 8, the lower surface (corresponding to the lower surface in FIG. 1) of the substrate 1 is bonded to a pad part 7a of a lead frame 7. An external connection power supply terminal part 71 wire-bonded to the power supply terminal Vcc by a bonding wire BW1, an external connection ground terminal part 72 wire-bonded to the ground terminal GND by a bonding wire BW2, and a plurality of external connection output terminal parts 73 wire-bonded respectively to the output terminals Vo1, Vo2, Vo3, and Vo4 by bonding wires BW3 are mounted or provided on a lead part 7b of the lead frame 7. The substrate 1, bonding wires BW1 to BW3, and lead frame 7 are sealed in a resin package 8. Although not illustrated, the bonding wires BW1 to BW3 are partially exposed from the outer surface of the package 8.

Figure 9:
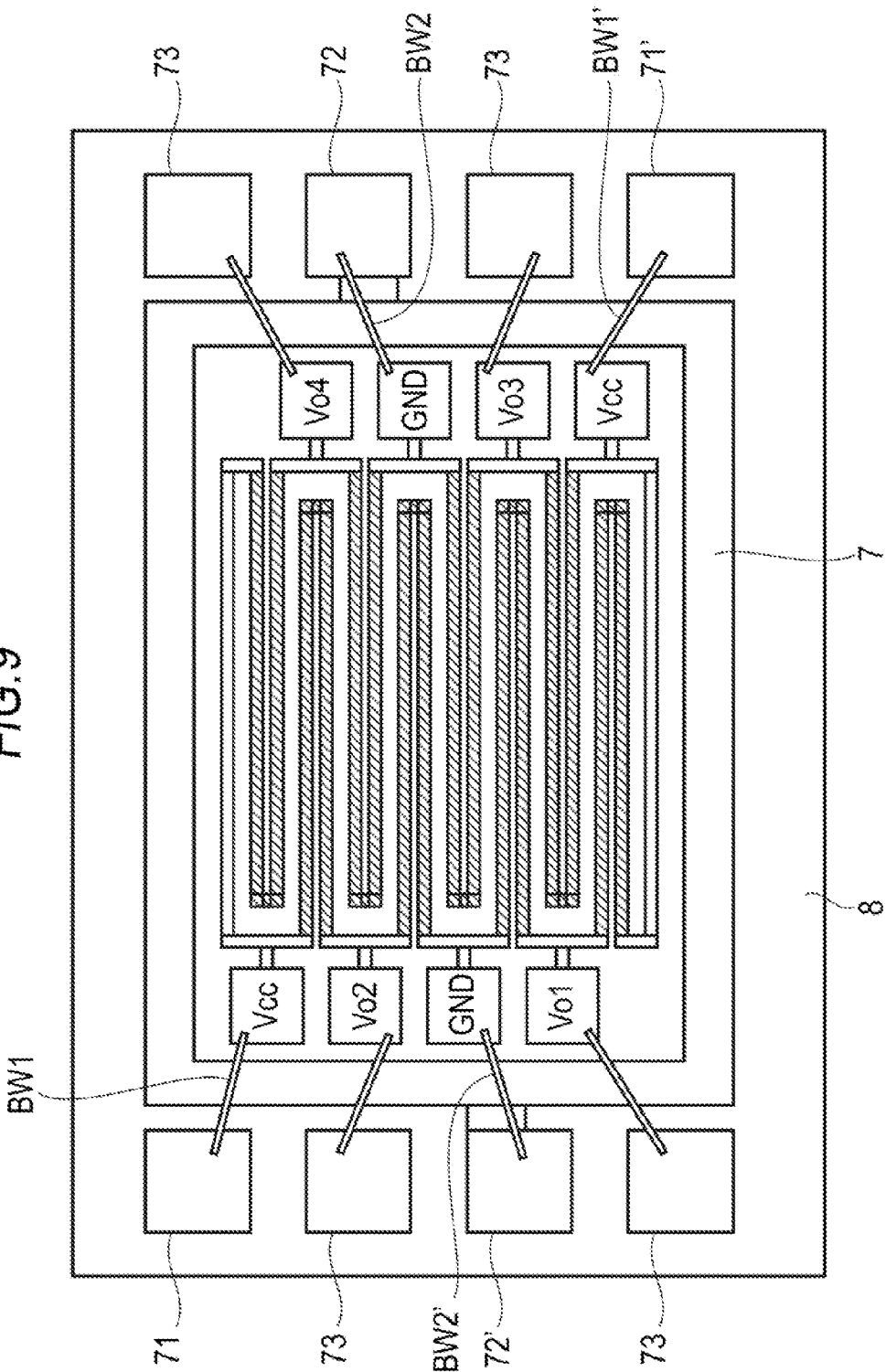
FIG. 9 A plan view schematically illustrating an example in which the magnetic sensor of a referential example is housed in a package.

FIG. 9 is a plan view schematically illustrating an example in which the magnetic sensor of a referential example is housed in a package used for comparison with the exemplary embodiment of the present invention as described above. In FIG. 9, the same reference numerals are given to the same members or same parts in FIG. 7.

The referential example of FIG. 9 has the same electrical circuit configuration as that of the exemplary embodiment of the present invention, and the content described in FIGS. 5 and 6 is applicable thereto. However, the referential example is not provided with the power supply connection wiring 21 and ground connection wiring 22 which are formed on the top surface of the substrate 1 and each formed of the patterned conductive film. Further, the referential example is not provided with the insulating film 3 of the exemplary embodiment. That is, the power supply terminal is not shared among all the electric current path units, and the ground terminal is not shared among all the electric current path units.

Thus, in addition to the power supply terminal Vcc disposed on the first side (left side in FIG. 9) at which the output terminals Vo1 and Vo2 of the first group are disposed, another power supply terminal Vcc is required to be disposed on the second side (right side in FIG. 9) at which the output terminals Vo3 and Vo4 of the second group are disposed. That is, two power supply terminals Vcc in total are disposed in the referential example. Similarly, in addition to the ground terminal GND disposed on the second side (right side in FIG. 9) at which the output terminals Vo3 and Vo4 of the second group are disposed, another ground terminal GND is required to be disposed on the first side (left side in FIG. 9) at which the output terminals Vo1 and Vo2 of the first group are disposed. That is, two ground terminals GND in total are disposed in the referential example.

Correspondingly, as illustrated in FIG. 9, in addition to the external connection power supply terminal part 71 wire-bonded to the power supply terminal Vcc by the bonding wire BW1, an external connection power supply terminal part 71' wire-bonded to the power supply terminal Vcc by a bonding wire BW1' is required to be provided. Similarly, in addition to the external connection ground terminal part 72 wire-bonded to the ground terminal GND by the bonding wire BW2, an external connection ground terminal part 72' wire-bonded to the ground terminal GND by a bonding wire BW2' is required to be provided.

As is clear from a comparison between FIGS. 7 and 9, in the referential example, four terminal parts are required both on the first side (left side in FIG. 9) and second side (right side in FIG. 9), while in the exemplary embodiment of the present invention, it is sufficient to provide only three terminal parts both on the first side (left side in FIG. 7) and second side (right side in FIG. 7), achieving sufficient miniaturization of the package.

Figure 10:
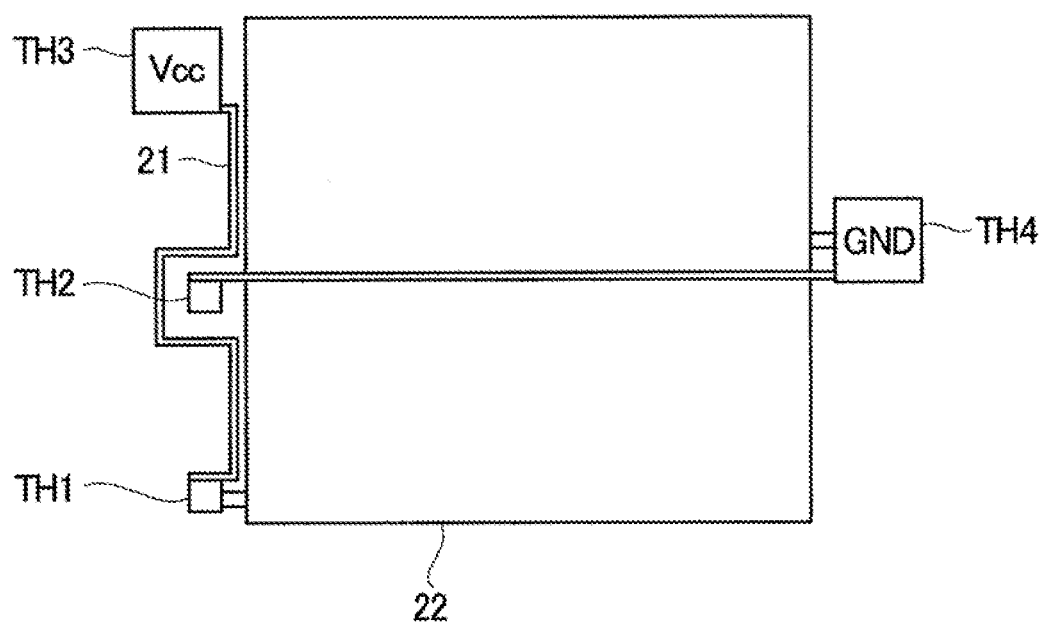
FIG. 10 A plan view schematically illustrating a modification of the magnetic sensor according to the exemplary embodiment of FIG. 1.

FIG. 10 is a plan view schematically illustrating a modification of the above-described magnetic sensor according to the exemplary embodiment of the present invention. FIG. 10 represents the positional relationship among the power supply connection wiring 21 and ground connection wiring 22 each formed of a patterned conductive film 2m, and the power supply terminal Vcc, ground terminal GND and through-holes TH1 and TH2 connected respectively to the power supply connection wiring 21 and ground connection wiring 22. This modification differs from the exemplary embodiment only in the shape of the ground connection wiring 22. That is, the ground connection wiring 22 is formed including a planar area of a size containing all the MR elements R1 to R8. The phrase "a planar area of a size containing all the MR elements R1 to R8" means that all the MR elements R1 to R8 and all the portions between the adjacent MR elements are contained in the planar area as viewed in the surface normal direction of the substrate 1. This planar area is formed substantially in a rectangular shape.

According to the above modification, all the MR elements R1 to R8 are shielded by the conductive film 2m constituting the ground connection wiring 22, thereby advantageously preventing malfunction of the sensor due to external electromagnetic waves. Further, according to the modification, the substrate on which the MR elements R1 to R8 are formed is made flat without having uneven portions, so that it is possible to ensure uniform photolithography exposure as a whole at the time of patterning the magnetoresistance effect film, making the shape of a photoresist pattern stable and enhancing etching accuracy at the time of patterning the magnetoresistance effect film. As a result, resistance values of the MR elements R1 to R8 thus formed are increased in accuracy.

Next, an exemplary embodiment of a magnetic sensor manufacturing method according to the present invention will be described.

FIGS. 11 to 20 are each a cross-sectional view schematically illustrating a manufacturing process of the magnetic sensor according to the exemplary embodiment.

As illustrated in FIG. 11, the plate-like base member 1a made of silicon, glass, or alumina is prepared.

Then, as illustrated in FIG. 12, the insulating layer 1b is formed on the top surface of the plate-like base member 1a to thereby form the substrate 1 having the insulating surface part. The insulating layer 1b may be obtained by forming a silicon oxide ($SiO_2$) film or silicon nitride ($Si_3N_4$) film using a CVD method or a sputtering method. In the case where the plate-like bar member 1a is made of silicon, the insulating layer 1b may be obtained by forming a thermally-oxidized film through a high pressure oxidation process. The thickness of the insulating layer 1b is, e.g., 0.5 μm.

Subsequently, as illustrated in FIG. 13, the conductive film 2m is formed on the top surface of the substrate 1, i.e., on the surface of the insulating layer 1b. The conductive film 2m may be obtained by forming an aluminum (Al) film using a sputtering method or a vapor-deposition method. The thickness of the conductive film 2m is, e.g., 0.5 μm.

Figure 14:
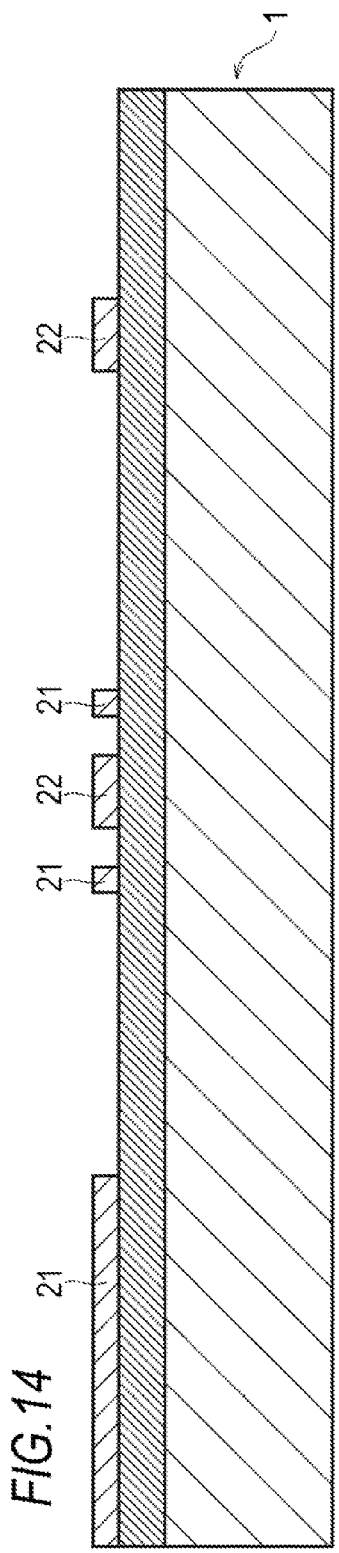
FIG. 14 A cross-sectional view schematically illustrating a manufacturing process of the magnetic sensor according to the exemplary embodiment of FIG. 1.

Then, as illustrated in FIG. 14, the conductive film 2m is subjected to patterning to form the power supply connection wiring 21 and ground connection wiring 22 having required shapes. This patterning may be conducted by photolithography and dry etching.

Figure 15:
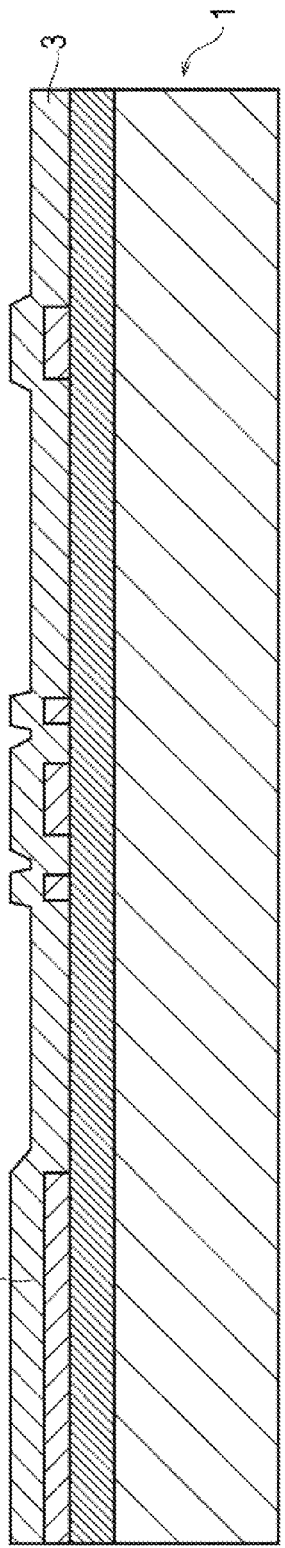
FIG. 15 A cross-sectional view schematically illustrating a manufacturing process of the magnetic sensor according to the exemplary embodiment of FIG. 1.

Then, as illustrated in FIG. 15, the insulating film 3 is formed on the insulating layer 1b of the substrate 1 so as to cover the power supply connection wiring 21 and ground connection wiring 22. The insulating film 3 may be obtained by forming a silicon oxide ($SiO_2$) film or silicon nitride ($Si_3N_4$) film using a CVD method or a sputtering method. The thickness of the insulating film 3 is, e.g., 0.8 μm.

Figure 16:
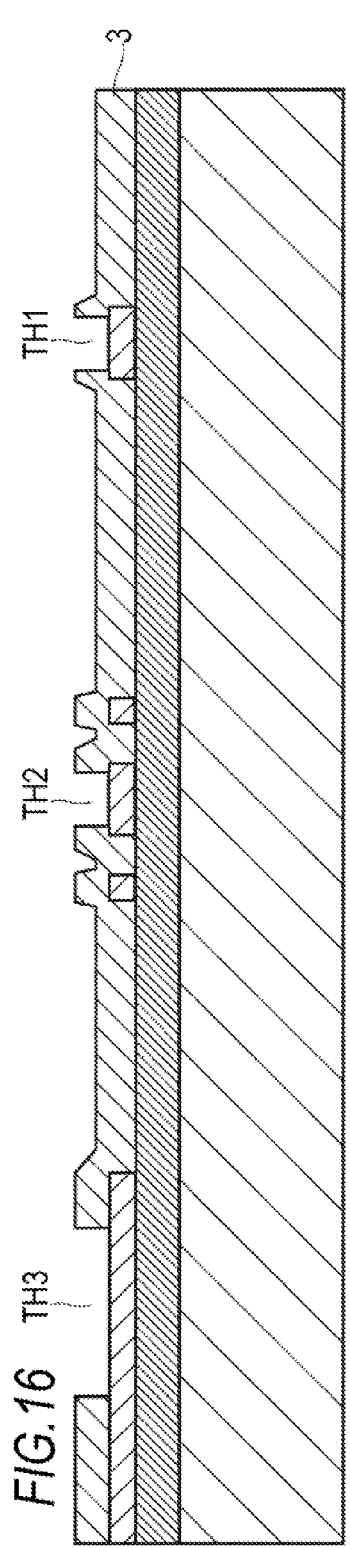
FIG. 16 A cross-sectional view schematically illustrating a manufacturing process of the magnetic sensor according to the exemplary embodiment of FIG. 1.

Then, as illustrated in FIG. 16, the through-holes TH1 to TH5 are formed in required positions of the insulating film 3. The through-holes may be formed by photolithography and dry etching. Although only some of the through-holes are illustrated in FIG. 16, other through-holes are formed in required positions in the same manner.

Then, as illustrated in FIG. 17, the magnetoresistance effect film 4m and conductor layer 5m are formed on the insulating film 3 in this order. The magnetoresistance effect film 4m may be obtained by forming a nickel-iron (Ni—Fe) alloy film or a nickel-iron-cobalt (Ni—Fe—Co) alloy film using a sputtering method or a vapor-deposition method. The thickness of the magnetoresistance effect film 4m is, e.g., 0.03 μm. The conductor layer 5m may be obtained by forming an aluminum (Al) film using a sputtering method or vapor-deposition method. The thickness of the conductor layer 5m is, e.g., 0.6 μm.

Then, as illustrated in FIG. 18, the magnetoresistance effect film 4m and conductor layer 5m are patterned into a shape corresponding to a required electric current path unit. At this time, portions corresponding to the power supply terminal, ground terminal, and output terminals, as well as portions corresponding to the through-hole TH1 used for connection with the power supply connection wiring 21 and through-hole TH2 used for connection with the ground connection wiring 22 are made to remain. This patterning may be conducted by photolithography and dry etching.

Figure 19:
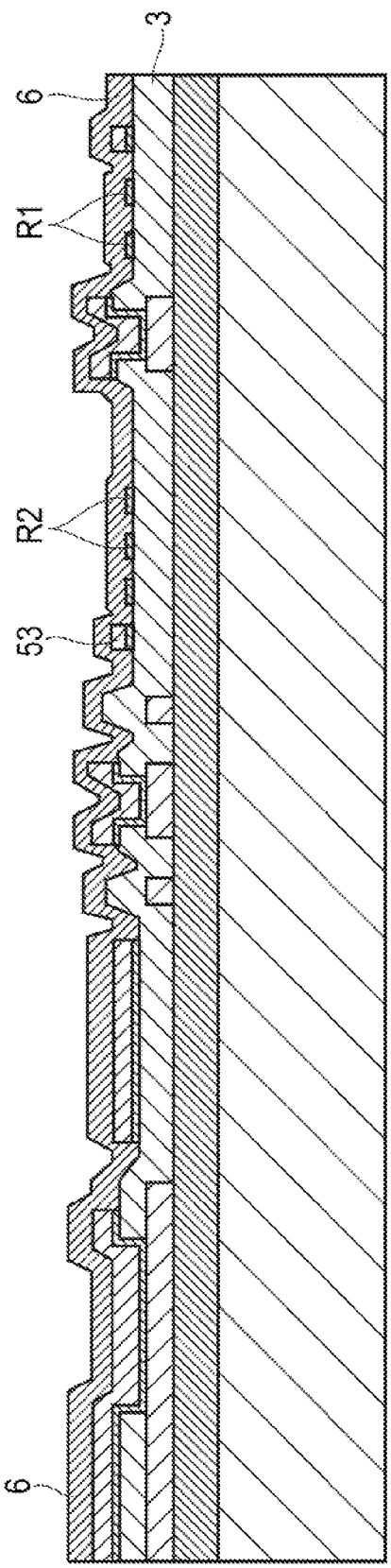
FIG. 19 A cross-sectional view schematically illustrating a manufacturing process of the magnetic sensor according to the exemplary embodiment of FIG. 1.

Then, as illustrated in FIG. 19, out of the remaining conductor layer 5m, only portions corresponding to the MR elements R1 to R8 are removed to form the MR elements R1 to R8 each formed of the magnetoresistance effect film 4m, as well as one end conductive connecting part 52, other end conductive connecting part 53, and intermediate conductive connecting part 51 each having a laminated structure of the magnetoresistance effect film 4m and conductor layer 5m. The portion of the conductor layer 5m corresponding to the MR elements R1 to R8 may be removed through photolithography and wet etching. At this time, a wet etching solution that does not react with the magnetoresistance effect film 4m is selected. As a result, the electric current path units 41, 42, 43, and 44 are formed on the insulating film 3. At this time, some of the one end conductive connecting parts 52 connected to the MR elements R1 to R8 and extending up to one ends of the electric current path units 41, 42, 43, and 44 are connected to the power supply connection wiring 21 through the required through-hole TH1, and some of the other end conductive connecting part 53 connected to the MR elements R1 to R8 and extending up to the other ends of the electric current path units 41, 42, 43, and 44 are connected to the ground connection wiring 22 through the required through-hole TH2. Although only some of the MR elements, only some of the conductive connecting parts, and only some of the electric current path units are illustrated in FIG. 19, other MR elements, other conductive connecting parts, and other electric current path units are formed in required positions in the same manner.

Further, the insulating protective film 6 is formed on the insulating film 3 so as to cover the remaining magnetoresistance effect film 4m and conductor layer 5m. The insulating protective film 6 may be obtained by forming a silicon oxide ($SiO_2$) film or silicon nitride ($Si_3N_4$) film using a CVD method or a sputtering method. The thickness of the insulating protective film 6 is, e.g., 0.8 μm.

Figure 20:
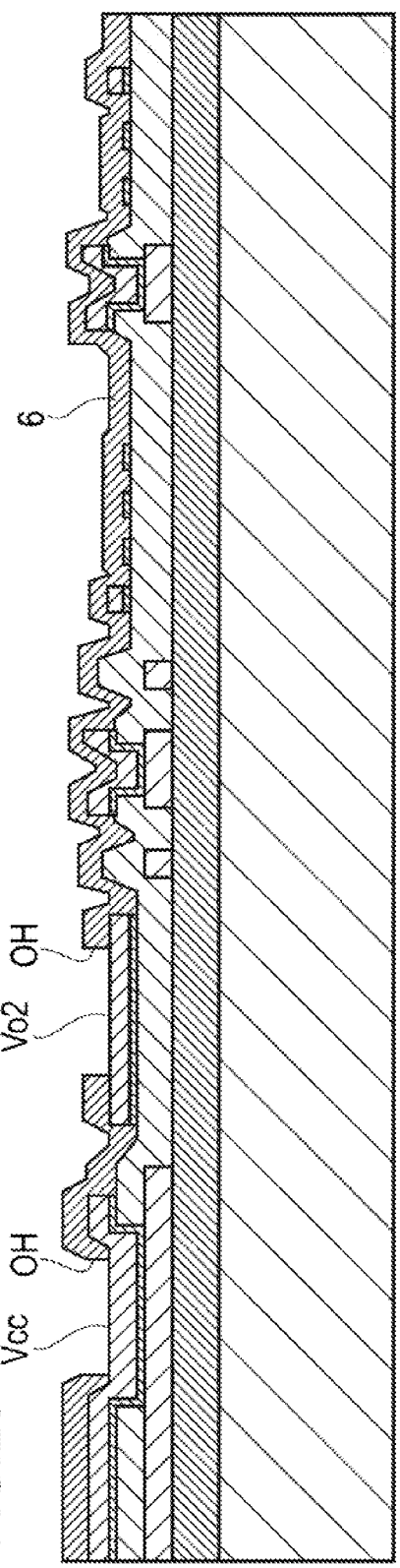
FIG. 20 A cross-sectional view schematically illustrating a manufacturing process of the magnetic sensor according to the exemplary embodiment of FIG. 1.

Then, as illustrated in FIG. 20, the apertures OH are formed in required positions of the insulating protective layer 6, and the power supply terminal Vcc, ground terminal GND, and output terminals Vo1, Vo2, Vo3, and Vo4 are formed by some portions of the laminated structure of the magnetoresistance effect film 4m and conductor layer 5m that are exposed through the apertures OH. The apertures OH may each be formed through photolithography and dry etching. Although only some apertures and only some terminals are illustrated in FIG. 20, other apertures and other terminals are formed in required positions in the same manner.

The above-mentioned embodiments are preferable embodiments of the present invention. Here, the scope of the present invention is not limited only to the above embodiments. The present invention can be embodied with various modifications without departing from the scope of the present invention. Accordingly, the above-mentioned embodiments are simply examples and limited construe should be avoided. The scope of the present invention is defined by the scope of the claims without being limited by description of the application and abstract. Further, changes and modifications belonging to a scope equivalent to the scope of the claims are within the scope of the present invention. Furthermore, not limited to a specific communication method or a device, the present invention can be applied to various communication methods and devices.

This application claims the benefit of Japanese Patent Application No. 2011-37200 filed on Feb. 23, 2011. The entire description disclosed in Japanese Patent Application No. 2011-37200 is included in this application.

DESCRIPTION OF REFERENCE NUMERALS

1 Substrate
1a Plate-like base member
1b Insulating layer
21 Power supply connection wiring
22 Ground connection wiring
2m Conductive film
3 Insulating film
41, 42, 43, 44 Electric current path unit
R1-R8 MR element (magnetoresistance effect element)
4m Magnetoresistance effect film
4a, 4a' Elongated part of U-like unit part
4b Connecting part of U-like unit part
U U-like unit part of MR element
51 Intermediate conductive connecting part of electric current path unit
52 One end conductive connecting part of electric current path unit
53 Other end conductive connecting part of electric current path unit
Vo1, Vo2, Vo3, Vo4 Output terminal
Vcc Power supply terminal
GND Ground terminal
5m Conductor layer
TH1-TH5 Through-hole
6 Insulating protective film
OH Aperture
MM Multipolar magnet
7 Lead frame
7a Pad part
7b Lead part
71, 71' External connection power supply terminal part
72, 72' External connection ground terminal part
73 External connection output terminal part
BW1-BW3, BW1' and BW2' Bonding wire
8 Resin package

The invention claimed is:

1. A magnetic sensor, comprising:
a power supply terminal and a ground terminal;
a conductive pattern including power supply connection wiring connected to the power supply terminal and ground connection wiring connected to the ground terminal;
an insulating film located on top of the conductive pattern;
four electric current path units located on top of the insulating film such that the conductive pattern is in contact with a first side of the insulating film and the electric current path units are in contact with a second side of the insulating film, two of the electric current path units being part of a first group and two of the electric current path units being part of a second group;
each electric current path unit including a respective pair of first and second elongated magneto resistive elements extending parallel to each other, a first end of the first and second elongated magneto resistive elements being connected to each other via a connection portion which is connected to an output terminal for the respective electric current path unit, a second end of the first magneto resistive element being connected to the power supply, a second end of the second magneto resistive element being connected to the ground terminal;
all of the elongated magneto resistive elements extending in the same direction such that they are all parallel to one another, the elongated magneto resistive elements of the first group of electric current path units being interdigitated with the elongated resistive elements of the second group of current path units;
the magneto resistive elements being bounded by an area having first and second opposite sides;
the output terminals of the electric current path units of the first group being disposed on the first side of the area the output terminals of each of the electric current path units of the second group being disposed on the second side of the area;
the power supply terminal being disposed on the first side of the area; and
the ground terminal being disposed on the second side of the area.

2. The magnetic sensor according to claim 1, wherein at least one of the magneto resistive elements is formed in a U-shape including two elongated parts extending parallel to one another and being connected by a connecting part.

3. The magnetic sensor according to claim 1, wherein at least one of the electric current path units includes a resistor element that is not a magneto resistive element.

4. The magnetic sensor according to claim 1, wherein the only resistance elements in each of the electric current path units are magneto resistive resistance elements.

5. The magnetic sensor according to claim 1, wherein each respective electric current path unit includes first and second end conductive connecting parts for connecting opposite ends of the respective electric current path unit to other electric current path units.

6. The magnetic sensor according to claim 1, wherein at least some of the second ends of the first magneto resistive elements are connected to the power supply via a respective opening in the insulating film and the power supply connection wiring.

7. The magnetic sensor according to claim 1, wherein at least some of the second ends of the second magneto resistive elements are connected to the ground terminal via a respective opening in the insulating film and the ground connection wiring.

8. The magnetic sensor according to claim 1, wherein the conductive pattern is located on and in contact with an insulating surface part of a substrate.

9. The magnetic sensor according to claim 8, further including a lead frame including a pad part, an external connection power supply terminal, an external connection ground terminal and a plurality of external connection output terminals; the substrate being bonded to the pad part;
   the external connection power supply terminal part being wire-bonded to the power supply terminal;
   an external connection ground terminal part being wire-bonded to the ground terminal; and
   the plurality of external connection output terminals being wire-bonded to the respective ones of output terminals.

10. The magnetic sensor according to claim 1, wherein an insulating protective film is located on top of the electric current path units.

11. The magnetic sensor according to claim 10, wherein respective apertures are formed in the insulating protective film so as to expose the power supply terminal, ground terminal, and output terminals, respectively.

12. A manufacturing method of the magnetic sensor as claimed in claim 5, the method comprising:
   forming a conductive film on an insulating surface part of a substrate and applying patterning to the conductive film to form the power supply connection wiring and the ground connection wiring;
   forming the insulating film on the insulating surface part of the substrate so as to cover the power supply connection wiring and ground connection wiring;
   forming through-holes in the insulating film;
   forming the electric current path units on the insulating film;
   connecting at least some of the end conductive connecting parts to the power supply connection wiring through respective ones of the through-holes;
   connecting at least some of the end conductive connecting parts to the ground connection wiring through respective ones of the through-holes;
   forming the power supply terminal so as to be connected to at least one of the end conductive connecting parts;
   forming the ground terminal to be connected to at least one of the end conductive connecting parts, and
   forming each of the output terminals to be connected to a respective one of the connection portions of the electric current path units.

13. The manufacturing method according to claim 12, wherein
   in forming the electric current path units, a magneto resistance effect film and a conductor layer are formed in this order on the insulating film, the magneto resistance effect film and conductor layer are patterned into a shape corresponding to required electric current path units, and then, out of the remaining conductor layer, only portions corresponding to the magneto resistive elements are removed to thereby form the magneto resistive elements, the end conductive connecting parts and the connection portions each having a laminated structure of the magneto resistance effect film and conductor layer.

14. The manufacturing method according to claim 13, wherein
   in patterning the magneto resistance effect film and conductor layer, portions corresponding to the power supply terminal, ground terminal, and output terminal are made to remain, an insulating protective film is formed on the insulating film so as to cover the remaining magneto resistance effect film and conductor layer, and apertures are formed in required positions of the insulating protective film, whereby the power supply terminal, ground terminal, and output terminal are formed by some portions of the laminated structure of the magneto resistance effect film and conductor layer that are exposed through the apertures.

* * * * *